United States Patent
Richter et al.

(10) Patent No.: US 9,226,348 B2
(45) Date of Patent: Dec. 29, 2015

(54) LIGHT-EMISSION DEVICE WITH AN OLED ELEMENT

(71) Applicant: TRIDONIC GMBH & CO. KG, Dresden (DE)

(72) Inventors: Lucien Richter, Dresden (DE); Joerg Amelung, Dresden (DE); Michael Eritt, Dresden (DE); Christian Kirchhof, Dresden (DE)

(73) Assignee: TRODONIC GMBH & CO. KG, Dresden (DE)

( * ) Notice: Subject to any disclaimer, the term of this patent is extended or adjusted under 35 U.S.C. 154(b) by 0 days.

(21) Appl. No.: 14/390,230

(22) PCT Filed: Apr. 2, 2013

(86) PCT No.: PCT/EP2013/056897
§ 371 (c)(1),
(2) Date: Oct. 2, 2014

(87) PCT Pub. No.: WO2013/150003
PCT Pub. Date: Oct. 10, 2013

(65) Prior Publication Data
US 2015/0054402 A1 Feb. 26, 2015

(30) Foreign Application Priority Data
Apr. 5, 2012 (DE) .......................... 10 2012 205 625

(51) Int. Cl.
*H01L 51/50* (2006.01)
*H01L 51/52* (2006.01)
(Continued)

(52) U.S. Cl.
CPC ............ *H05B 33/06* (2013.01); *H01L 27/3237* (2013.01); *H01L 27/3288* (2013.01);
(Continued)

(58) Field of Classification Search
CPC ........ H05B 33/04; H05B 33/06; H05B 33/14; H05B 33/502; H05B 33/22; H01L 2251/5315; H01L 51/5237; H01L 51/5246; H01L 27/3244; C09K 11/7734; Y02B 20/181

USPC .................................................. 313/498–512
See application file for complete search history.

(56) References Cited

U.S. PATENT DOCUMENTS 8,071,999 B2  12/2011  Amelung et al.
8,823,184 B2   9/2014  Ng et al.
(Continued)

FOREIGN PATENT DOCUMENTS

DE  102008027519  12/2009
DE  102010064231   7/2011
(Continued)

OTHER PUBLICATIONS

International Search Report for PCT/EP2013/056897, English translation attached to original, Both completed by the European Patent Office on Jun. 27, 2013, All together 7 Pages.

*Primary Examiner* — Anne Hines
*Assistant Examiner* — Jose M Diaz
(74) *Attorney, Agent, or Firm* — Brooks Kushman P.C.

(57) ABSTRACT

A light-emission device with a two-dimensional OLED element and an encapsulation element for protecting the OLED element. The light-emission device furthermore has a support, on which the OLED element is arranged in such a way that the encapsulation element points toward the support, and an electrical conductor element for an electrical connection between the support and the OLED element. wherein the electrical conductor element is elastic in a normal direction to the OLED element. By way of example, the conductor element can be helical. As a result of the elastic property thereof, the conductor element can absorb mechanical tension while ensuring reliable electrical contacting. Hence, this can reduce or even avoid the risk of the electrical connection between the support and the OLED element being disadvantageously influenced or impaired by forces which can occur when handling the light-emission device or which can be generated by temperature variations.

14 Claims, 3 Drawing Sheets

(51) Int. Cl.
*H01L 51/54* (2006.01)
*H05B 33/06* (2006.01)
*H01L 27/32* (2006.01)
*H05B 33/04* (2006.01)

(52) U.S. Cl.
CPC ............ *H01L51/5203* (2013.01); *H05B 33/04* (2013.01); *H01L 51/524* (2013.01); *H01L 2251/5361* (2013.01)

(56) References Cited

U.S. PATENT DOCUMENTS

| | | | |
|---|---|---|---|
| 8,933,616 B2 * | 1/2015 | Keser et al. | ............ 313/46 |
| 2006/0284557 A1 | 12/2006 | Takamura | |
| 2010/0148665 A1 | 6/2010 | Farquhar et al. | |
| 2010/0321937 A1 * | 12/2010 | Van Bommel et al. | ....... 362/235 |
| 2011/0156084 A1 | 6/2011 | Choi et al. | |
| 2014/0203253 A1 | 7/2014 | Goeoetz et al. | |

FOREIGN PATENT DOCUMENTS

| | | |
|---|---|---|
| DE | 102010032834 | 2/2012 |
| DE | 102011077687 | 12/2012 |
| EP | 2221900 | 8/2010 |
| EP | 2293358 | 3/2011 |
| JP | 2008269988 | 11/2008 |
| JP | 2010192819 | 9/2010 |
| WO | 2011023309 | 3/2011 |
| WO | 2012003872 | 1/2012 |

* cited by examiner

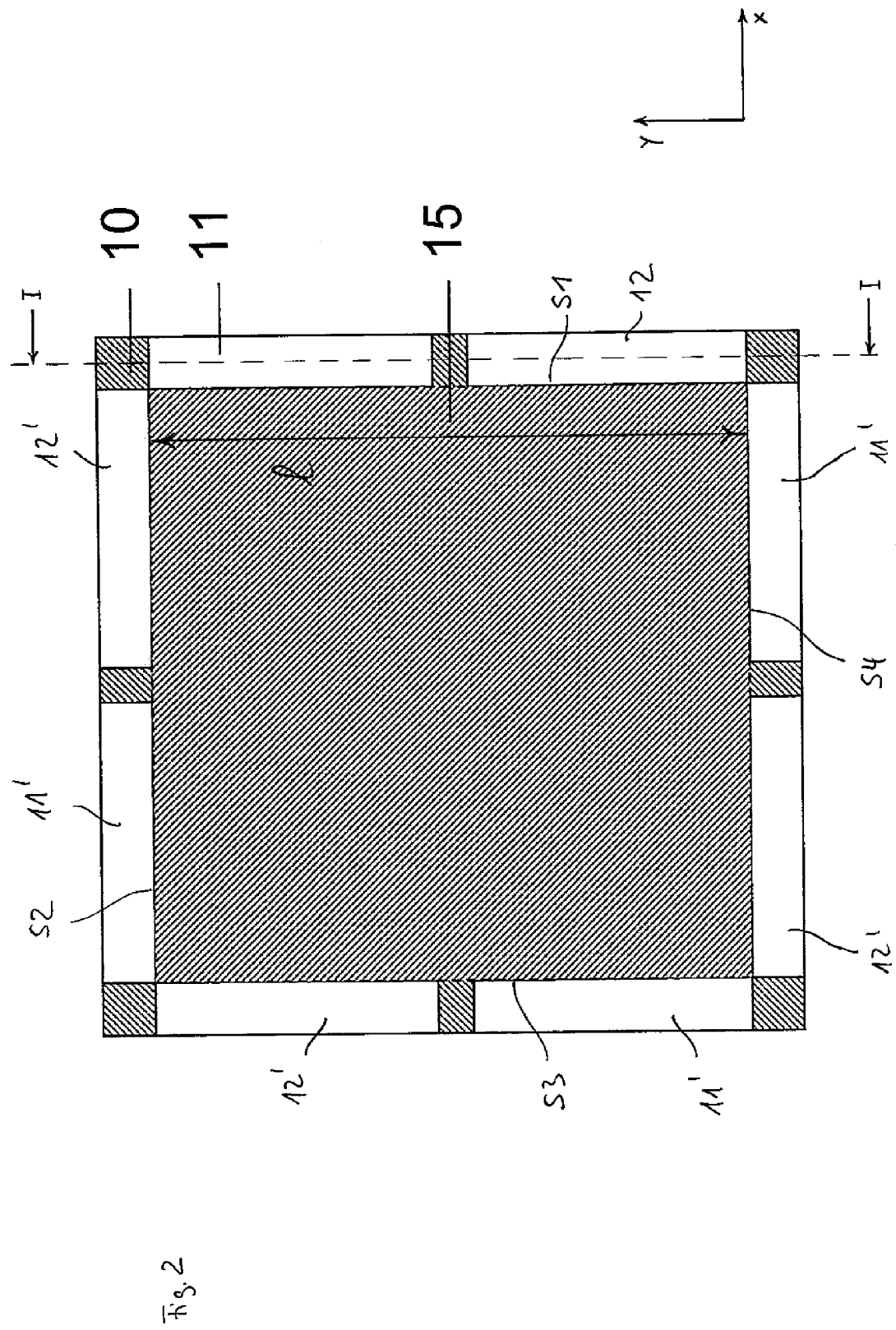

LIGHT-EMISSION DEVICE WITH AN OLED ELEMENT

CROSS-REFERENCE TO RELATED APPLICATIONS

This application is the U.S. national phase of PCT Application No. PCT/EP2013/056897 filed on Apr. 2, 2013, which claims priority to German Patent Application No. 10 2012 205 625.4 filed on Apr. 5, 2012, the disclosures of which are incorporated in their entirety by reference herein.

TECHNICAL FIELD

The invention relates to a light-emission device with a two-dimensional OLED element (OLED: organic light-emitting diode) and an encapsulation element for protecting the OLED element.

BACKGROUND

On the basis of the OLED, novel light-emission devices or luminous elements can be realized. As two-dimensional luminous bodies that have a moderate luminance in comparison with inorganic LEDs (LED: light-emitting diode), OLEDs are particularly suitable for the production of two-dimensional diffuse light sources, such as for example luminous panels. Large-area, diffusely radiating light sources are desired in particular for general lighting applications, with OLEDs offering promising future potential for these application areas. As a consequence of the thin-film technology used in the production of OLEDs, it can also become possible to realize flexible luminous bodies that open up previously unknown possibilities for lighting rooms.

SUMMARY

An OLED element has two two-dimensionally formed electrodes, between which an "active" or organic layer of organic material is embedded. When a suitable voltage is applied to it or it is impressed with a suitable current, the active organic layer emits light. At least one of the two electrodes is in this case transparent, in order to make it possible for the light generated to be given off through this electrode to the outside.

For practical applications, in particular general lighting applications, the most uniformly possible light-emitting OLEDs, i.e. OLEDs that give off light as uniformly as possible by way of their radiating surface, are desired or required. By analogy with inorganic LEDs, OLEDs are current-operated components. This means that the luminance of an OLED is correlated with the current flowing through the light-emitting, active layer of the OLED. To realize uniformly light-emitting OLEDs, a luminance that is homogeneous over the two-dimensional extent of the OLED within the light-emitting layer is therefore required. However, this is problematic in the production of correspondingly large-area OLED elements.

For example, the transparent electrode may be realized by means of a transparent conductive oxide (TCO: transparent conductive oxide) or by means of transparent metal layers. The electrical conductivity of these transparent electrode materials is comparatively low, and consequently the voltage drop within the electrode is not negligible. On account of the current/voltage characteristic of an OLED, small differences in voltage within an electrode surface area have the effect of undesired perceptible differences in brightness.

In a specific example, in the case of an OLED element, indium-tin oxide (ITO: indium tin oxide) with a layer thickness of about 100 nm may be used as the transparent electrode, the ITO layer being applied to a substrate, in particular a glass substrate, and possibly serving as an anode. This is followed by the organic or active layer, which may comprise multiple sub-layers, with a layer thickness of altogether about 100 to 200 nm. Subsequently, a metallic cathode, which may for example comprise aluminum, is applied with a layer thickness of about 100 to 500 nm in thickness. In the case of correspondingly large-area OLED elements, the highly ohmic resistance of the ITO layer may achieve values of 10 or 20 ohms/square. It must be borne in mind that, with respect to its overall two-dimensional form, electrical contacting of the ITO layer is only possible from the peripheral region.

For the protection of an OLED element constructed in this way, it is also known to provide an encapsulation element, which is arranged covering the two electrodes and the organic intermediate layer and which extends at the lateral peripheries up to the glass substrate.

Apart from a low effective sheet resistance of the transparent electrode, a feed-in of current that is as uniform as possible is therefore also particularly necessary for a uniformly radiating OLED. Thus, in order to improve the homogeneity of the luminance distribution of the radiated light over the two-dimensional extent of the OLED, often multiple feeding-in points for the operating current are provided in a distributed manner over the lateral peripheral region of the OLED element, i.e. there are peripherally on one or both electrodes multiple electrical contacting regions by way of which the electrodes are electrically contacted.

Typically, contacting of the OLED element that is as symmetrical as possible is aimed for here. In particular, the anode generally has multiple contacting regions, since it generally has a lower conductivity than the cathode. However, it may also be provided that the cathode or both electrodes, the anode and the cathode, have multiple contacting regions by way of which the operating current flows in and away.

The invention is based on the object of providing a corresponding improved light-emission device. In particular, the light-emission device is intended to have improved mechanical and electrical properties.

This object is achieved with the subject matter mentioned in the independent claim. Particular embodiments of the invention are specified in the dependent claims.

According to the invention, a light-emission device that has a two-dimensional OLED element and an encapsulation element for protecting the OLED element is provided. Furthermore, the light-emission device has a support, on which the OLED element is arranged in such a way that the encapsulation element faces the support, and an electrical conductor element for an electrical connection between the support and the OLED element, the electrical conductor element being elastic in a direction perpendicular to the OLED element.

Use of the support has the particularly suitable effect of allowing current to be supplied to the OLED element at multiple lateral peripheral areas of the OLED element. As a result, a particularly homogeneous supply of current to the OLED element is made possible. In this case, the conductor element can, on account of its elastic property, absorb mechanical stresses while ensuring reliable electrical contacting. This makes it possible to reduce or even avoid the risk of the electrical connection between the support and the OLED element being disadvantageously influenced or impaired by forces that can occur when handling the light-emission device or can be produced by temperature fluctuations. In this way, the electrical and mechanical properties of the light-emission device are improved.

The OLED element advantageously has an electrical contact region for a first electrode of the OLED element that is elongate—when considered perpendicularly to the OLED element—, the electrical conductor element being connected to the contact region in an electrically conducting manner. In this way it can be achieved that the voltage drop at the contact region is particularly small and the current input is particularly homogeneous. In this way, a particularly homogeneous light emission of the OLED element is consequently made possible. In this case, the electrical contact region is also preferably arranged alongside the encapsulation element—when considered perpendicularly to the OLED element. In this way, the OLED element can be suitably designed such that it has a particularly large light-emitting surface area.

Furthermore, at least in first approximation, the encapsulation element is preferably rectangular—when considered perpendicularly to the OLED element—, so that it accordingly has four sides, the electrical contact region being formed in such a way that, along one of the four sides, it extends over at least one quarter, preferably over at least one third, of the length of this one side. In this way, a particularly homogeneous current input into the OLED element is furthermore made possible.

Also advantageously with respect to a particularly homogeneous current input, the light-emission device also has at least one further contact region for the first electrode that is designed and arranged in a way analogous to the first-mentioned contact region for the first electrode.

Correspondingly advantageously, the light-emission device also has a second electrical contact region for a second electrode of the OLED element, the second contact region being designed and arranged in a way analogous to the contact region for the first electrode.

A particularly good electrical connection between the support and the OLED element can be achieved if the electrical conductor element consists of metal or is metallized. The electrical conductor element preferably consists of a metal foil or a metal wire or a flexible printed circuit board. In particular, the electrical conductor element may consist of copper or aluminum or an alloy from or with copper and/or aluminum.

The electrical conductor element is advantageously electrically connected to the contact region for a first electrode and/or to a support contact region formed on the support by way of at least one joining location, preferably by way of multiple joining locations. Furthermore, the at least one joining location is in this case formed by soldering or adhesive bonding, in particular with an anisotropic adhesive or a conductive adhesive. In this way, particularly reliable electrical contacting is made possible.

Particularly suitable elasticity of the electrical conductor element can be achieved if the conductor element is elongate and has a 180° bend in a portion along its length. In particular, the electrical conductor element may be spiral or undulating.

BRIEF DESCRIPTION OF THE DRAWINGS

The invention is explained in more detail below on the basis of exemplary embodiments and with reference to the drawings, in which:

FIG. 2 shows a diagram of a view of a rear side of the OLED element of the light-emission device.

DETAILED DESCRIPTION

Figure 1:
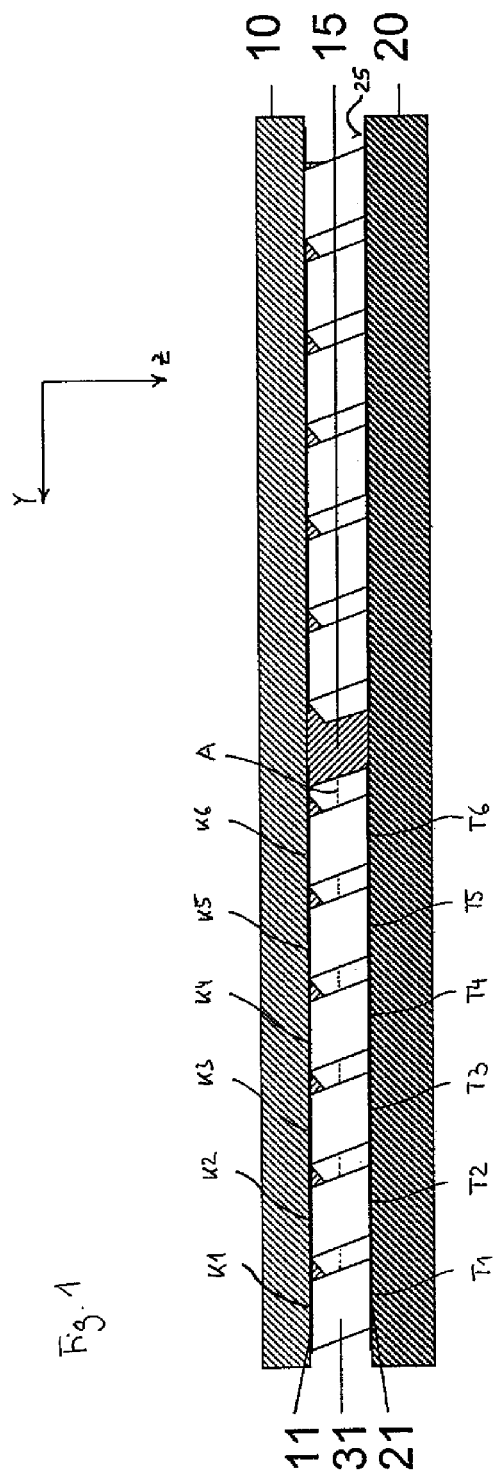
FIG. 1 shows a diagram of a cross section through a light-emission device according to the invention as provided by a first exemplary embodiment.

In FIG. 1, a diagram of a cross section through a light-emission device according to the invention is shown. The light-emission device comprises an OLED element, an encapsulation element 15 and a support 20.

In FIG. 2, a view of the OLED element and the encapsulation element 15—without the support 20—is shown. In addition, FIG. 2 is used as a basis for discussing the OLED element and the encapsulation element 15.

The OLED element is formed in such a way that it is two-dimensional overall. It therefore has a significantly greater extent in a first direction x and in a second direction y, oriented at right angles to the first direction, than in a third direction z, which is oriented at right angles to the first direction x and at right angles to the second direction y. For example, it may be provided that the extent of the OLED element in the direction z is less than one tenth of its extent in the direction x and/or its extent in the direction y.

The two-dimensional form of the OLED element accordingly allows the definition of a plane in which the OLED element has a maximum projecting surface area—in the example shown therefore a plane that is defined by the directions x and y. In FIG. 1 there is shown in this sense a view of the OLED element perpendicularly to this plane or in (or counter to) the direction z. This direction is also referred to here as "perpendicular to the OLED element" or "perpendicular" for short.

As is the case in the example shown, the extent of the OLED element in the direction x may be equal to its extent in the direction y, so that, when considered "perpendicularly", it has a square form. It may, however, also be designed such that, when correspondingly considered, it has generally a rectangular form or some other form, for example a hexagonal form.

The OLED element may be of such a size that—when considered perpendicularly—it has a surface area of at least 1 cm2, preferably of at least 10 cm2, for example at least 20 cm2.

The OLED element may be constructed in the way described at the beginning. In particular, it may accordingly have four layers, to be precise—from the "rear" to the "front" with reference to the diagram of FIG. 1—a substrate 10, for example a glass substrate, a first electrode arranged thereupon, an organic layer arranged on the first electrode and a second electrode arranged on the organic layer.

The encapsulation element 15 may be designed in particular in such a way that it extends over that electrode that lies opposite the substrate 10 with reference to the organic layer. The encapsulation element 15 may for example be formed from glass. It may be formed by a sheet.

As shown by way of example in FIG. 2, the encapsulation element 15 preferably has—when considered perpendicularly—a smaller surface area than the substrate 10, it being located completely within the perpendicular projection of the substrate 10. In this way, it can extend at all its lateral peripheries up to the substrate 10, and thus protect the electrodes and the organic layer particularly well from environmental influences.

Accordingly, in the view outlined in FIG. 1, the two electrodes and the organic layer are covered by the encapsulation element 15.

The OLED element also has an electrical contact region 11 for a first electrode, for example for the anode. When considered perpendicularly, the contact region 11 is preferably elongate. In this way it can be achieved that the current input into the OLED element for operating the OLED element is particularly uniform and, as a consequence, the light emission of the OLED element is particularly homogeneous. Furthermore, the elongate design allows contacting of the first electrode to be achieved with a particularly low transfer resistance.

As is the case in the example shown, the contact region 11 may be arranged alongside the encapsulation element 15—when seen perpendicularly to the OLED element. In particular, —when considered perpendicularly—the contact region 11 is arranged within the perpendicular projection of the substrate 10 but outside the perpendicular projection of the encapsulation element 15. When considered in this way, the contact region 11 preferably directly borders the encapsulation element 15 with one of its two longitudinal sides. Given a robust design of the OLED element, this design allows a particularly large light-emitting surface area of the OLED element to be achieved.

When considered perpendicularly, the encapsulation element 15 preferably has the same form as the substrate 10, but with a slightly smaller surface area. Thus, in particular with correspondingly concentric alignment of these two parts, a peripheral region on which the contact region 11 is arranged can be formed on the substrate 10.

As is the case in the example shown, the encapsulation element 15 may accordingly be rectangular, at least in first approximation, so that it accordingly has four sides S1, S2, S3, S4. A particularly good current input can be achieved if the contact region 11 is formed in such a way that, along one of the four sides, here the side S1, it extends over almost half the length l of this side S1. For example, the design may be such that the contact region 11 extends over at least one quarter, preferably over at least one third, of the length l.

The OLED element advantageously also has at least one further contact region 11' for the first electrode, which is designed and arranged in a way analogous to the first-mentioned contact region 11 for the first electrode, in particular is arranged analogously on at least one further side of the four sides S2, S3, S4. In particular, a correspondingly designed further contact region 11' for the first electrode may be respectively arranged on each of the three further sides S2, S3, S4.

For the second electrode or the cathode, the design is preferably analogous with respect to at least one contact region 12 or corresponding further contact regions 12'. In this case, the contact regions 11, 11' for the first electrode are preferably arranged such that they alternate with the contact regions 12, 12' for the second electrode, in particular running around the periphery of the encapsulation element 15.

As shown, a contact region 11, 11' for the first electrode and a contact region 12, 12' for the second electrode are advantageously formed respectively on each of the four sides S1, S2, S3, S4. If in this case—as shown by way of example in FIG. 2—the design is also such that a contact region 11, 11' of the first electrode and a contact region 12, 12' of the second electrode respectively lie precisely opposite in each case on two opposing sides of the four sides S1, S2, S3, S4, a particularly homogeneous current input into the OLED element can be realized.

A corresponding design with respect to the contact regions for the two electrodes may for example also be provided in the case of a corresponding hexagonal form of the encapsulation element 15 or of the OLED element.

As indicated in FIG. 2 by I-I, the section shown in FIG. 1 extends perpendicularly to the direction x and thereby runs through the contact region 11. The substrate 10 of the OLED element can be seen in FIG. 2, but the further individual layers of the OLED element are not represented for reasons of overall clarity. Furthermore, the contact region 11 and the encapsulation element 15 can be seen.

The OLED element is therefore arranged on the support 20 such that the encapsulation element 15 faces the support 20. The support 20 may likewise be of a two-dimensional design and in that case be arranged such that it is aligned parallel to the OLED element. The support 20 may in this case be for example a support plate.

The support 20 is preferably designed in such a way that, when the OLED element is viewed perpendicularly, it has a surface area that is at least as large as the surface area of the encapsulation element 15, preferably at least as large as the surface area of the OLED element, the relative arrangement between the support 20 and the OLED element being such that the perpendicular projection of the encapsulation element 15, preferably of the OLED element, lies completely within the perpendicular projection of the support 20, or at most is congruent with the latter. This makes it possible that, starting from the support 20, the feed-in of current is brought up to the OLED elements from all lateral peripheral regions thereof, so that the feed-in of current is particularly uniform.

The support 20 may be transparent or not transparent. For example, the support 20 may consist of glass, PMMA (polymethylmethacrylate), PET (polyethylene terephthalate), metal or plastic. For example, the support 20 may be formed by a PET film.

The support 20 may have a surface 25, which faces the OLED element and on which conductor tracks are applied for supplying current to the OLED element, or be correspondingly formed as a PCB (printed circuit board). In particular, on the support 20, preferably on the surface 25, there may be formed a support contact region 21, which is designed or intended for electrically conducting connection to the OLED element and which is accordingly electrically connected for example to one of the conductor tracks. The support contact region 21 is preferably also elongate, preferably in a way analogous to the contact region 11 for the first electrode.

In particular when a film or flexible PCB is used, the OLED element may be flexibly designed, so that the light-emission device as a whole can be flexibly designed.

Furthermore, the light-emission device has an electrical conductor element 31 for an electrical connection between the support 20 and the OLED element 10. The electrical conductor element 31 may be accordingly electrically connected on the side of the support 20 in particular to the support contact region 21 and on the side of the OLED element to the contact region 11.

The electrical conductor element 31 is designed in such a way that it is elastic in a direction perpendicular to the OLED element 10—here in the direction z. In this way it is achieved that the electrical contact between the conductor element 31 and the OLED element on the one hand and the support 20 on the other hand is reliably retained even in the event of mechanical loading of the light-emission device or stress caused by temperature fluctuations.

In the first exemplary embodiment shown here, the electrical conductor element 31 is spirally designed to achieve the elastic property, in particular—as shown —, such that the conductor element 31 extends along a cylindrical, preferably circular-cylindrical spiral. The orientation of the conductor element 31 is in this case preferably such that the axis A—indicated in FIG. 1 by dotted lines—of the spiral or of the conductor element 31 is oriented parallel to the longitudinal axis of the contact region 11 or to the side S1 of the encapsulation element 15. The diameter of the conductor element 31 perpendicularly to the axis A thereof corresponds in this case at least substantially to the distance between the contact region 11 and the support 20, so that a contact location on the contact region 11 and a contact location on the support 20 are respectively formed within a turn of the spiral.

The conductor element 31 preferably has multiple turns, for example at least three turns, so that at least three contact locations are respectively formed on the contact region 11 on the one hand and the support 20 on the other hand. In the example shown, the conductor element 31 has six turns, so that six contact locations K1 ... K6 are formed on the contact region 11 and six contact locations T1 ... T6 are formed on the support 20 or on the support contact region 21.

To achieve a particularly homogeneous supply of current, the conductor element 31 in this case preferably extends over at least 80% of the length of the contact region 11.

The conductor element 31 is preferably metallic. The contact locations K1 ... K6 are preferably formed by a joining technique or are joining locations. The joining locations between the conductor element 31 and the contact region 11 are formed for example by adhesive bonding, in particular with a conductive adhesive or an anisotropic adhesive. The joining locations between the conductor element 31 and the support 20 or the support contact region 21 are formed for example by adhesive bonding, in particular with a conductive adhesive or an anisotropic adhesive, or by soldering.

The combination of the solid connection by means of a joining technique with the intrinsically flexible conductor element 31 makes it possible particularly suitably for absorbing mechanical stresses, such as may occur when there are changes in temperature or under mechanical loading of the light-emission device. The current transmission is in this case reliably ensured. The risk of damage to the solid connecting contacts is prevented or at least significantly reduced.

The light-emission device preferably has a correspondingly designed further conductor element for each further contact region 11' for the first electrode.

The electrical connection of the second electrode or cathode is preferably provided in an analogous way.

In particular, the design of the light-emission device is preferably analogous on all four sides S1, S2, S3, S4.

In this way, a multi-sided feed-in of the currents into the OLED element 10 is realized. In the case of such a multi-sided feed-in of the currents into the OLED element 10, the "individual connections" for the anode and cathode respectively are preferably brought together by way of the support 20. In this case, an additional series resistor or additional conductor track length may be used if need be to set the current conduction such that the organic layer of the OLED element is supplied with current in such a way that particularly homogeneous illumination of the surface area or emission of light can be achieved.

A possibly existing different current profile on the support 20 can be compensated by a correspondingly chosen, suitable dimensioning of the supply lines to the individual connection areas or contacting regions of the support 20, and a particularly good homogeneity of the light of the OLED element can thus be achieved.

The metallic conductor element 31 also makes it possible for the current be directed very well in the transverse direction or in the direction y; this would not be ensured by contact pads alone, on account of the limited transverse conductivity.

Figure 3:
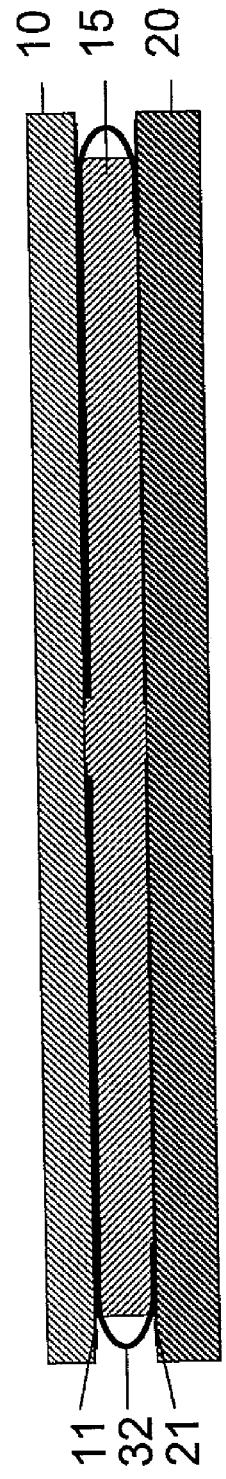
FIG. 3 shows a diagram, corresponding to FIG. 1, in relation to a second exemplary embodiment

In FIG. 3, a diagram corresponding to FIG. 1 in relation to a second exemplary embodiment is shown. Unless otherwise mentioned, the statements made with respect to the first exemplary embodiment also apply analogously to the second exemplary embodiment. The designations are used analogously.

In the case of the second exemplary embodiment, the electrical conductor element, here denoted by 32, consists of a thin, highly conductive metal foil or a metal wire or a flexible printed circuit board, for example of copper, aluminum or an alloy from or with these materials. The feed-in of current on the OLED element 10 takes place in this way two-dimensionally, in particular by a contact between the conductor element 32 and the contacting region 11 that is formed longitudinally along the contacting region 11. The contact is preferably in turn formed by a joining technique, for example by means of conductive adhesive or anisotropic adhesive, so that an elongate joining location is formed. The joining location is in this case advantageously made to be of such a size that it extends over at least 80% of the length of the contact region 11.

The contacting region 11 may be formed for example by thin-film or thick-film technology. The comparatively low conductivity of the contacting region 11 can be increased by a corresponding joining technique.

On the side of the support 20, the connection may in turn be realized likewise by means of a corresponding joining technique (for example a soldering technique, conductive adhesive, anisotropic adhesive).

The electrical connection of the cathode may in turn be formed in an analogous way.

The conductor element 32 may for example be metallic or metallized.

The conductor element 32 according to the second exemplary embodiment also makes possible particularly good compensation of thermally induced or mechanical stresses that would lead to a failure of the contact connection in the case of a corresponding rigid connection.

Figure 4:
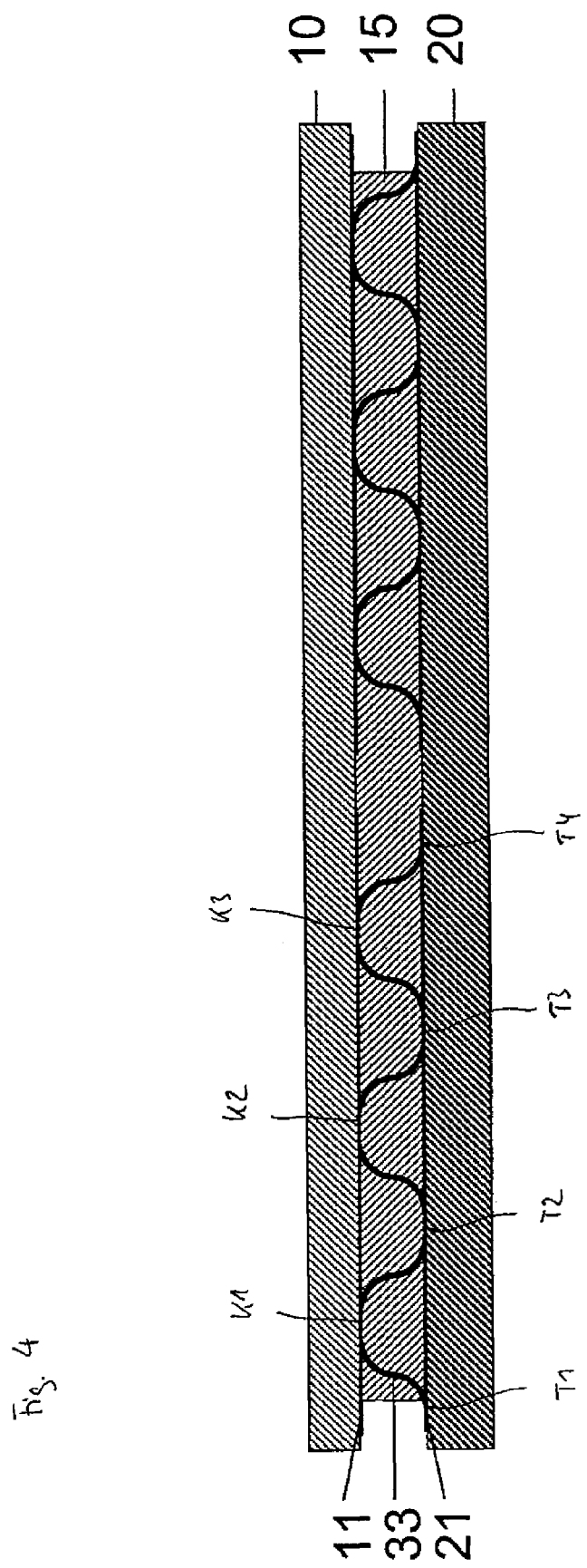
FIG. 4 shows a corresponding diagram in relation to a third exemplary embodiment.

In FIG. 4, a diagram corresponding to FIG. 1 in relation to a third exemplary embodiment is shown. Unless otherwise mentioned, the above statements also apply analogously to the third exemplary embodiment. The designations are in turn used analogously.

The electrical conductor element, here denoted by 33, is designed according to the third exemplary embodiment in an undulating form, so that—as in the case of the first exemplary embodiment—multiple contact locations, here for example three contact locations K1 ... K3 are formed on the contact region 11 and multiple contact locations, here by way of example four contact locations T1 ... T4, are formed on the support 20 or on the support contact region 21.

"Distributed contacting", which can compensate very well for thermal loadings or mechanical stresses and makes possible a connection that is stable in the long term, is in turn made possible in this way.

It can be stated more generally with respect to all of the exemplary embodiments that the conductor element 31, 32, 33 is preferably elongate to achieve its elastic property and thereby has a 180° bend in a portion along its length. In particular, the alignment of the conductor element 31, 32, 33 is in this case such that the 180° bend is formed in a plane oriented at right angles to the two-dimensional OLED element. In the case of the first exemplary embodiment, the 180° bend is formed in a plane defined by the direction x and the direction z, in the case of the second exemplary embodiment in a plane defined by the direction y and the direction z.

The multiple contact locations or joining locations in the case of the first and third exemplary embodiments or a correspondingly elongate joining location in the case of the second exemplary embodiment allows the current input into the OLED element to be realized with particularly little loss.

The OLED element and/or the support 20 and/or contact areas may be made transparent or opaque.

It may also be provided that multiple OLED elements are arranged correspondingly on the support 20.

The light-emission device according to the invention is distinguished in particular by the following properties:

robust connection of the OLED element to the support particularly homogeneous current distribution within the OLED element to achieve a particularly homogeneous emission of light low transfer resistances between the electrical conductor element and the OLED element high efficiency of the light-emission device

The invention claimed is:

1. A light-emission device, comprising:
   a two-dimensional OLED element,
   an encapsulation element for protecting the OLED element,
   a support, on which the encapsulation element and the OLED element are arranged with the encapsulation element located between the support and the OLED element, and
   at least one electrical conductor element for an electrical connection between the support and the OLED element, the at least one electrical conductor element being elastic in a direction perpendicular to the OLED element;
   wherein, the encapsulation element, when viewed perpendicularly to a two-dimensional plane of the OLED element, has a smaller surface area than a substrate layer of the OLED element, which is located completely within the perpendicular projection of the substrate layer.

2. The light-emission device as claimed in claim 1, in which the OLED element has a first electrical contact region for a first electrode of the OLED element that is elongate when considered perpendicularly to the OLED element, the electrical conductor element being connected to the contact region in an electrically conducting manner.

3. The light-emission device as claimed in claim 2, in which the electrical contact region is arranged alongside the encapsulation element when considered perpendicularly to the OLED element.

4. The light-emission device as claimed in claim 3, wherein the encapsulation element is generally rectangular when considered perpendicularly to the OLED element, so that it accordingly has four sides and the electrical contact region is formed in such a way that, along one of the four sides, it extends over at least one quarter of the length of the one side.

5. The light-emission device as claimed in claim 2, further comprising a second electrical contact region for the first electrode, the second electrical contact region being designed and arranged in a way analogous to the first electrical contact region for the first electrode.

6. The light-emission device as claimed in claim 2, which has a second electrical contact region for a second electrode of the OLED element, the second contact region being designed and arranged in a way analogous to the contact region for the first electrode.

7. The light-emission device as claimed in claim 1, in which the electrical conductor element consists of metal or is metallized.

8. The light-emission device as claimed in claim 1, in which the electrical conductor element consists of a metal foil or a metal wire or a flexible printed circuit board.

9. The light-emission device as claimed in claim 1, in which the electrical conductor element consists of copper or aluminum or an alloy from or with copper and/or aluminum.

10. The light-emission device as claimed in claim 1, in which the electrical conductor element is electrically connected to a contact region for a first electrode and a support contact region formed on the support by way of at least one joining location.

11. The light-emission device as claimed in claim 10, in which the at least one joining location is formed by soldering or adhesive bonding, in particular with an anisotropic adhesive or a conductive adhesive.

12. The light-emission device as claimed in claim 1, in which the electrical conductor element is elongate and has a 180° bend in a portion along its length.

13. The light-emission device as claimed in claim 1, in which the electrical conductor element is spiral.

14. The light-emission device as claimed in claim 1, in which the electrical conductor element is undulating.

* * * * *